United States Patent
Lu et al.

(10) Patent No.: US 6,596,611 B2
(45) Date of Patent: Jul. 22, 2003

(54) METHOD FOR FORMING WAFER LEVEL PACKAGE HAVING SERPENTINE-SHAPED ELECTRODE ALONG SCRIBE LINE AND PACKAGE FORMED

(75) Inventors: Ming Lu, Taipei (TW); Szu-Wei Lu, Hsinchu (TW)

(73) Assignee: Industrial Technology Research Institute, Hsin Chu (TW)

( * ) Notice: Subject to any disclaimer, the term of this patent is extended or adjusted under 35 U.S.C. 154(b) by 1 day.

(21) Appl. No.: 09/846,932

(22) Filed: May 1, 2001

(65) Prior Publication Data

US 2002/0163069 A1 Nov. 7, 2002

(51) Int. Cl.⁷ .............................................. H01L 21/301
(52) U.S. Cl. ........................................ 438/462; 438/619
(58) Field of Search .................................. 438/618, 460, 438/462

(56) References Cited

U.S. PATENT DOCUMENTS 6,111,317 A * 8/2000 Okada et al. ................ 257/737
6,358,836 B1 * 3/2002 Lu et al. ....................... 438/618
6,365,498 B1 * 4/2002 Chu et al. ..................... 438/612

OTHER PUBLICATIONS

Tummala, R.R.; Rymaszewski, E.J. Klopfenstein, A.G.; *Microelectronics Patckageing Handbook: Semiconductor Packaging*, Chapman & Hall, 1997, pp. 152–154.*

* cited by examiner

Primary Examiner—John F. Niebling
Assistant Examiner—Christopher Lattin
(74) Attorney, Agent, or Firm—Tung & Associates

(57) ABSTRACT

A method for forming wafer level package that has a serpentine-shaped electrode formed along a scribe line in-between two adjacent IC dies and the package formed are disclosed. In the method, each of the I/O redistribution lines connecting from an I/O redistribution pad is connected to a serpentine-shaped electrode for providing electrical communication during a subsequent electro-deposition process for forming a solder bump on the corresponding I/O redistribution pad. During a dicing operation of the wafer level package, a single cut through the center of the serpentine-shaped electrode can effect severance of all IC dies without possibility of any inter-die shorting or intra-die shorting.

19 Claims, 4 Drawing Sheets

METHOD FOR FORMING WAFER LEVEL PACKAGE HAVING SERPENTINE-SHAPED ELECTRODE ALONG SCRIBE LINE AND PACKAGE FORMED

FIELD OF THE INVENTION

The present invention generally relates to a method for forming a wafer level package and package formed and more particularly, relates to a method for forming a wafer level package that has serpentine-shaped electrode in-between each two of a plurality of IC dies along a scribe line and package formed by such method.

BACKGROUND OF THE INVENTION

In recent years, wafer level packages or wafer level chip scale packages have been developed as a new low cost packaging technique for high volume production of IC chips. One of the chip scale packaging techniques has been developed by the Tessera Company for making a so-called micro-BGA package. The micro-BGA package can be utilized in an environment where several of the packages are arranged in close proximity on a circuit board or a substrate much like the arrangement of individual tiles. Major benefits achieved by a micro-BGA package are the combined advantages of a flip chip assembly and a surface mount package. The chip scale packages can be formed in a physical size comparable to that of an IC chip even though, unlike a conventional IC chip such as a flip chip, the chip scale package does not require a special bonding process for forming solder balls. Furthermore, a chip scale package may provide larger number of input/output terminals than that possible from a conventional quad flat package, even though a typical quad flat package is better protected mechanically from the environment.

In a typical micro-BGA package, a flexible interposer layer (which may contain circuit) is used to interconnect bond pads on an IC chip to an array of solder bump connections located on a flexible circuit. The flexible circuit, normally of a thickness of approximately 25 nm, is formed of a polymeric material such as polyimide which is laminated to a silicon elastomer layer of approximately 150 nm thick. The silicon elastomeric layer provides flexibility and compliance in all three directions for relief of stresses and thermal expansion mismatches. To further reduce the fabrication cost of IC devices, it is desirable that if a whole wafer can be passivated to seal the IC dies on the wafer, and then be severed into individual IC dies from the wafer such that not only the benefits of a chip scale package can be realized, the packaging cost for the IC dies may further be reduced.

The conventional flip-chip bonding process requires multiple preparation steps for IC chips, i.e. the formation of aluminum bond pads on the chip, the under-bump-metallurgy process on the bond pads and the deposition of solder required in the bumping process. The substrate that the IC chip is bonded to requires a flux coating in order to ensure an acceptable bond strength is formed between the solder bumps and the conductive elements on the substrate surface. The flip chip bonding process further requires a reflow process for the bumps, a flux cleaning process to eliminate excess flux material from the surface of the bump, a drying process after the cleaning process, an underfill process for dispensing an underfill material, and an underfill curing process to minimize thermal stresses in the underfill and in the joint formed.

The conventional method for depositing solder bumps described above presents a number of processing difficulties. For instance, in modern high-density semiconductor devices, the distance between I/O pads in a peripheral array continuously being reduced. In order to maintain a minimal required distance between the I/O pads, an I/O pad redistribution process must be conducted such that the pads can be transformed from a peripheral array to an area array. During the pad redistribution process, a plurality of metal traces must be formed to extend the I/O pads from the periphery of an IC die to the center of the IC die. It is desirable that, in order to assure the reliability of the die, a stress buffer layer is provided under the plurality of metal traces to buffer, or absorb, the stress incurred during the fabrication processes and to avoid stress cracking or fracture of the metal traces. The application of the stress buffering layers has been difficult in that if too thin a layer is applied, the stress buffering effect is insufficient to ensure the reliability of the IC die. However, when too thicker a layer of the stress buffering material is applied, numerous processing difficulties are incurred in the application process. Even though commercial stress buffering materials have been available in the marketplace, the fabrication technology for applying such materials to a satisfactory thickness has not been developed.

In the current technology for fabricating wafer level chip scale packages (WL-CSP), the input/output (I/O) redistribution layer and the electroplating seed layer must be deposited in separate processing steps. The two layers must be separately deposited by a sputtering technique, photo-lithographically exposed and developed, and then etched in different etching steps. The fabrication process requires complicated process steps resulting in a high cost fabrication process and a low fabrication yield.

Furthermore, in order to carry out an electroplating process for filling the solder bump openings formed in a photoresist layer, a common electrode must be formed in-between the plurality of IC dies to provide electrical communication with each I/O redistribution lines that also serve as an I/O redistribution pad for growing a solder bump thereon. The common electrode is conventionally laid out as a straight line in-between two IC dies along the scribe line that is latter used for severing the dies during a dicing step. The severing of IC dies from each other is normally performed by sawing with a diamond disk along a common electrode line. Any misalignment between the diamond saw blade and the common electrode line can lead to intra-die or inter-die shorting.

FIGS. 1A–1D illustrate a conventional solder bump formation process on I/O redistribution pads. For instance, FIG. 1A is an enlarged, cross-sectional view of a wafer 10 that has a conductive pad 12 formed on a silicon substrate 14 and insulated by an insulating layer 16. An I/O redistribution line 20 is formed on top of the conductive pad 12 insulated by a second insulating layer 22 with an opening 18 for an I/O redistribution pad. A metal seed layer 24 is then deposited over the top of the wafer 10. Alternatively, an under-bump-metallurgy layer can be deposited in place of the metal seed layer 24. This is shown in FIG. 1B.

In the following step, as shown in FIG. 1C, on top of the metal seed layer 24 is deposited a thick photoresist layer 26, a window is then opened in the photoresist layer 26 and filled with a solder bump 28. In the final step of the process, as shown in FIG. 1D, the photoresist layer 26 and the metal seed layer 24 are etched away at areas not covered by the solder bump 28. The solder bump 28 is then reflown into a solder ball 30. The wafer 10 is then severed by a diamond saw blade 32 along a scribe line in-between the plurality of IC dies.

The conventional process shown above in FIGS. 1A–1D for forming solder bumps by an electroplating technique requires the pre-deposition of a metal seed layer before the plating process can be carried out. Moreover, a common electrode for electrical communication during the plating process is laid in-between the plurality of IC dies in a linear manner such that the complete severing of the electrode demands an accurate diamond sawing process. These various processing steps lead to a high cost and time consuming fabrication process. Furthermore, when an etching method is used to remove the metal seed layer under the photoresist layer, the process frequently leads to an oxidation of the solder bumps which may lead to a problematic solder reflow process. Moreover, after the solder reflow process, there is no convenient way for increasing the solder ball thickness or improving the surface characteristics of the solder balls.

It is therefore an object of the present invention to provide a method for forming wafer level packages that do not have the drawbacks or shortcomings of the conventional methods.

It is another object of the present invention to provide a method for forming wafer level packages that do not require the deposition of a metal seed layer for the electroplating of solder bumps.

It is a further object of the present invention to provide a method for forming wafer level packages that have a serpentine-shaped electrode situated along a scribe line such that the electrode can be completely severed in a single slicing operation.

It is another further object of the present invention to provide a method for forming wafer level packages that have a serpentine-shaped electrode formed along a scribe line wherein the electrode can be formed in the same deposition process for forming the I/O redistribution lines.

It is still another object of the present invention to provide a method for forming wafer level packages that have a serpentine-shaped electrode formed along a scribe line wherein the electrode has a saw-tooth shape.

It is yet another object of the present invention to provide a wafer level package that has a serpentine-shaped electrode formed between each two of a plurality of IC dies.

It still another further object of the present invention to provide a wafer level package that has a serpentine-shaped electrode formed between each two of a plurality of IC dies during the same formation process for the I/O redistribution lines.

It is yet another further object of the present invention to provide a wafer level package that has a saw-tooth-shaped electrode formed between each two of a plurality of IC dies that can be severed by a diamond saw in a single cutting operation.

SUMMARY OF THE INVENTION

In accordance with the present invention, a method for forming wafer level packages that have a serpentine-shaped electrode formed along a scribe line in-between each two of a plurality of IC dies and the package formed are disclosed.

In a preferred embodiment, a method for forming wafer level package that has a serpentine-shaped electrode formed along a scribe line can be carried out by first providing a wafer that is preprocessed with a plurality of IC dies formed on a top surface, each of the plurality of IC dies has a plurality of input/output pads formed on top, each of the plurality of IC dies is spaced-apart from its immediate adjacent IC dies by a border that has at least a width of a scribe line; depositing a first metal layer on the top surface of the wafer and patterning into an I/O redistribution line with a first end in electrical communication with one of the plurality of I/O pads and a second end extending toward the border between the immediate adjacent IC dies, the patterning step further forms a serpentine-shaped electrode for a subsequent plating step on the border in electrical communication with the second end of the I/O redistribution line; depositing an insulating layer on the top surface of the wafer and forming an opening over an I/O redistribution pad exposing the first metal layer; depositing a photoresist layer to a thickness sufficient for forming a solder bump and forming an opening to expose the I/O redistribution pad; depositing a solder paste by a plating technique filling the opening to form a solder bump; and removing the photoresist layer and reflowing the solder bump into a solder ball.

The method for forming wafer level package that has a serpentine-shaped electrode formed along a scribe line may further include the step of depositing the first metal layer from a metal of Al, Cu or alloys thereof, or the step of forming the plurality of input/output pads on the plurality of IC dies from a metal of Al, Cu or alloys thereof, or the step of forming the serpentine-shaped electrode from Al, Cu or alloys thereof in a saw-tooth configuration. The method may further include the step of depositing the solder paste of a lead-containing or a non-lead-containing solder, or the step of depositing the solder paste by a technique of electroplating or electroless plating. The method may further include the step of, prior to the solder paste deposition step, depositing an under-bump-metallurgy layer on the I/O redistribution pad. The method may further include the step of dicing the plurality of IC dies from the wafer by cutting with a diamond saw through a center of the serpentine-shaped electrode, or the step of cutting through the serpentine-shaped electrode with a diamond saw to sever the plurality of IC dies and to prevent any inter-die or intra-die shorting. The method may further include the step of depositing the solder paste from a material containing Pb and Sn.

The present invention is further directed to a wafer level package that has a serpentine-shaped electrode formed between each two of a plurality of IC dies which includes a wafer that is preprocessed with a plurality of IC dies formed on a top surface, each of the plurality of IC dies has a plurality of input/output pads formed on top, each of the plurality of IC dies being spaced-apart from its immediate adjacent IC dies by a border that has at least a width of a scribe line; a plurality of I/O redistribution lines each has a first end in electrical communication with one of the plurality of I/O pads and a second end extending toward the border between the immediate adjacent IC dies; a serpentine-shaped electrode for use in a plating step positioned on the border that has a multiplicity of leads each in electrical communication with one of the second end of the plurality of I/O redistribution lines; an insulating layer overlying the top surface of the wafer that has openings over the I/O redistribution pads exposing the first metal layer; and a solder ball formed on each of the plurality of I/O redistribution pads.

In the wafer level package that has a serpentine-shaped electrode formed in-between each two of a plurality of IC dies, the plurality of input/output pads are formed of Al, Cu or alloys thereof, the I/O redistribution line may be formed of a metal of Al, Cu or alloys thereof. The package may further include an under-bump-metallurgy layer between the solder ball and the I/O redistribution pad. The serpentine-shaped electrode may be formed of an electrically conductive metal. The serpentine-shaped electrode may be formed in a saw-tooth-shaped configuration.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses a method for forming wafer level package that has a serpentine-shaped electrode, i.e. a saw-tooth-shaped electrode, formed along a scribe line in-between two adjacent IC dies. The serpentine-shaped electrode can be formed in the same process for forming the I/O redistribution lines and thus, no additional processing steps are required for carrying out the present invention method. After the electrode is used in the electroplating, or electroless plating step for forming the solder bumps, the electrode can be easily severed by a single cut utilizing a diamond saw and eliminating all possible inter-die or intra-die shorts. By utilizing the present invention novel method, the deposition step of a metal seed layer required in a conventional wafer level packaging method may be saved and not necessary. Even though, a UBM layer can be desirably used in the solder bump openings prior to the bump deposition process.

Figure 1A:
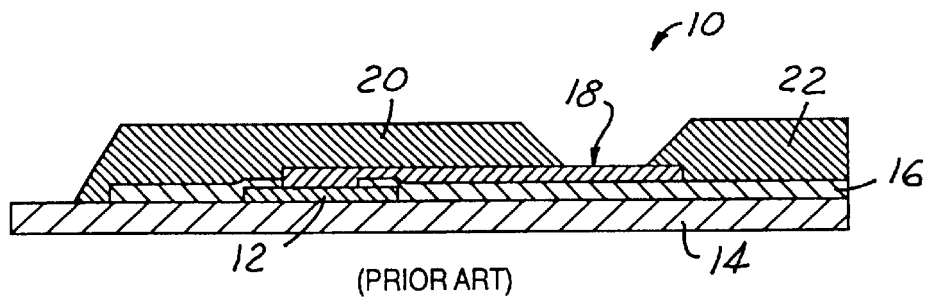
FIGS. 1A–1D are enlarged, cross-sectional views illustrating a conventional solder ball forming process on an I/O redistribution pad.
Figure 1B:
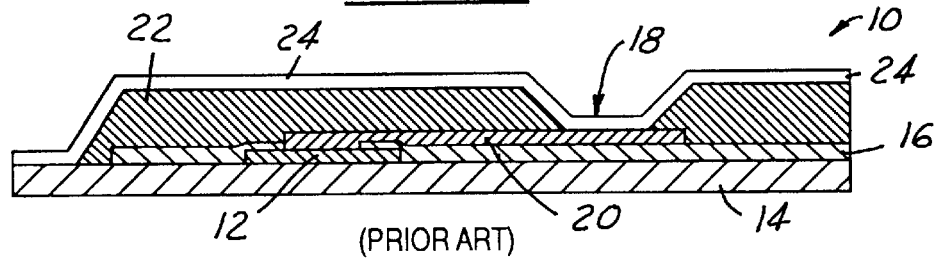
Figure 1C:
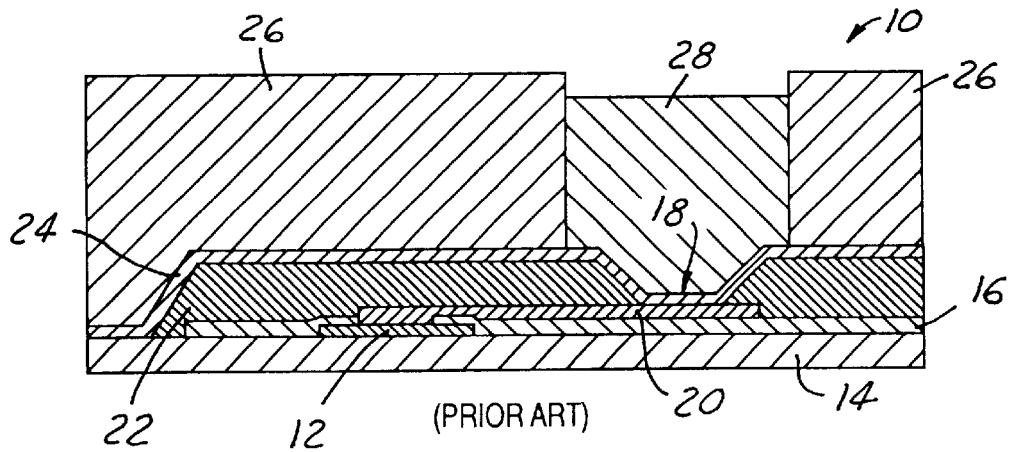
Figure 1D:
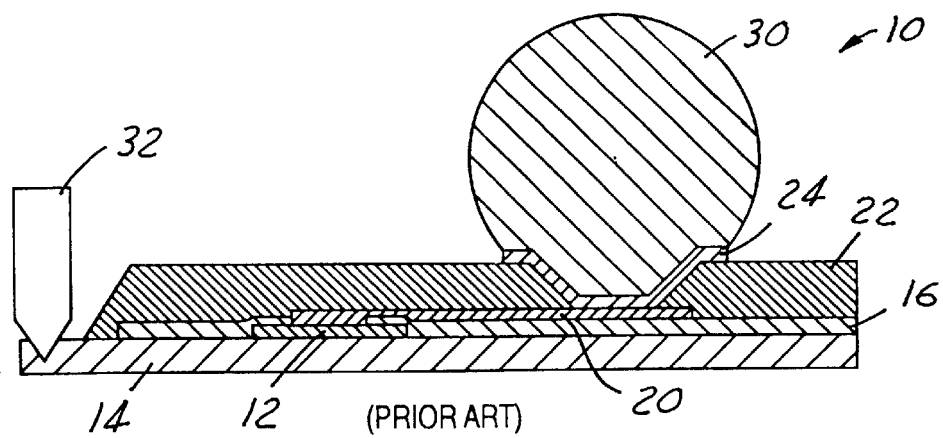
Figure 2A:
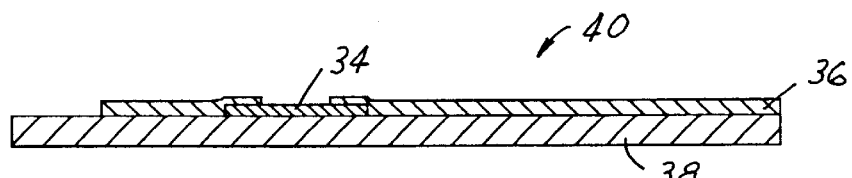
FIGS. 2A–2H are enlarged, cross-sectional views of the present invention method for forming solder balls on I/O redistribution pads wherein the I/O redistribution lines are in electrical communication with a serpentine-shaped electrode situated in-between two immediately adjacent IC dies.
Figure 2B:
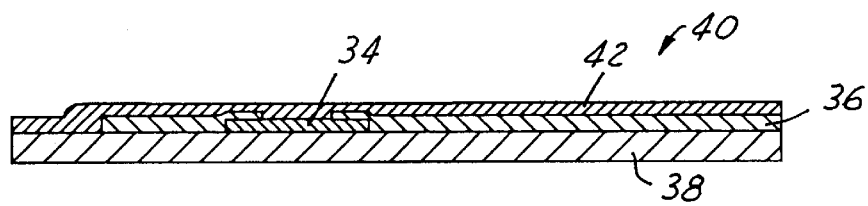
Figure 2C:
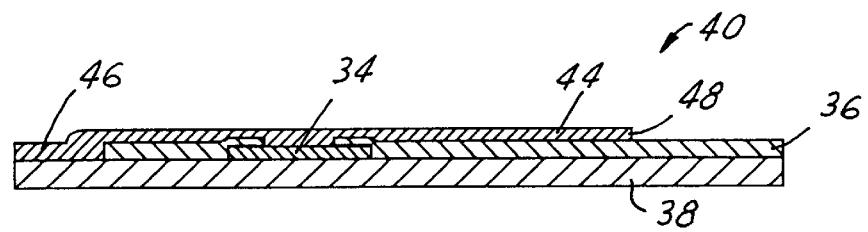
Figure 2D:
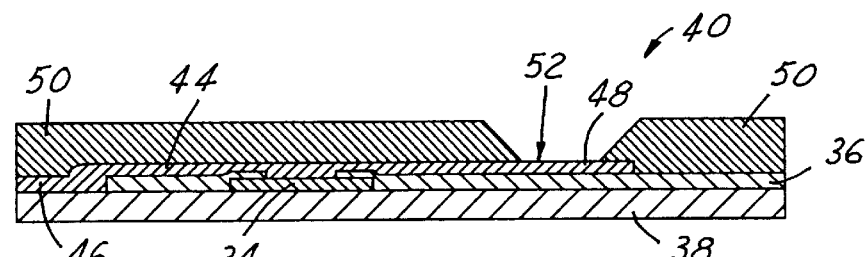

Referring initially to FIG. 2A, wherein an enlarged, cross-sectional view of a present invention wafer 40 is shown. The wafer 40 is pre-processed for forming IC circuits having an input/output pad 34 formed in an insulating material layer 36 on top of the pre-processed substrate 38. In the first step of the process, a first metal layer 42, such as Al, Cu or alloys thereof, is sputter deposited on top of the wafer 40. The first metal layer 42, as shown in FIG. 2B, can be photolithographically formed into an I/O redistribution line 44, as shown in FIG. 2C. It should be noted that a first end 46 of the I/O redistribution line 44 is extended to the far end of the pre-processed substrate 38, i.e. into a border region between the two IC dies. In the next step of the process, the second end 48 of the I/O redistribution line 44 is first covered by an insulating material layer 50, followed by the opening of a window 52 to expose the second end 48 of the I/O redistribution line 44. The insulating material layer 50 may be suitably formed of a photosensitive polyimide material.

Figure 2E:
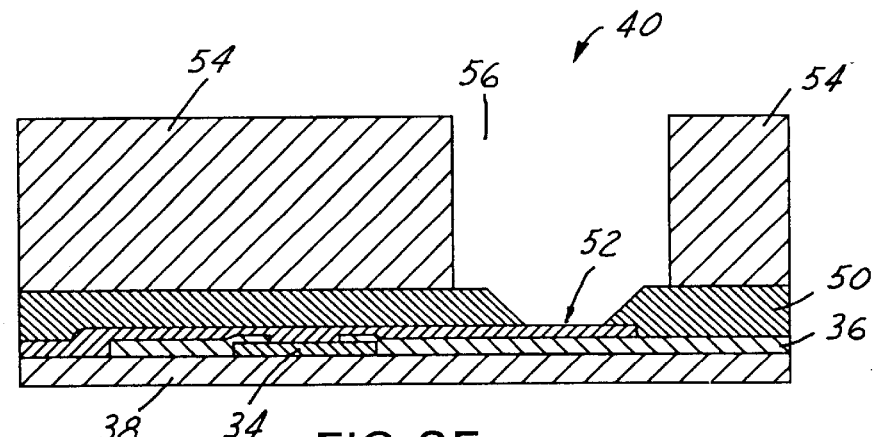
Figure 2F:
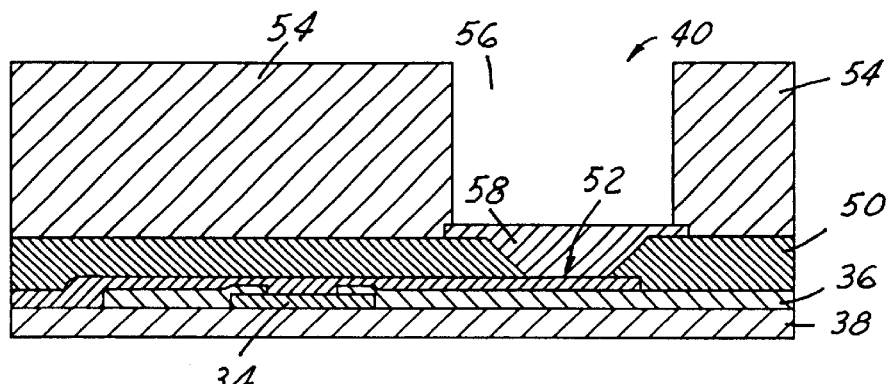

In the next step of the process, as shown in FIG. 2E, the present invention semiconductor structure 40 is coated with a thick photoresist layer 54 that has a thickness of at least 20 $\mu$m, and preferably a thickness between about 20 $\mu$m and about 200 $\mu$m. The word "about" used in this writing indicates a range of value that is ±10% of the average value given. The photoresist layer 54 is then patterned to provide window 56 over the I/O redistribution pad 52. A UBM material is then deposited into the opening 56 overlying the I/O redistribution pad 52 forming a UBM layer 58. The deposition of the UBM layer 58 can be accomplished by either electroplating or sputtering.

Figure 3A:
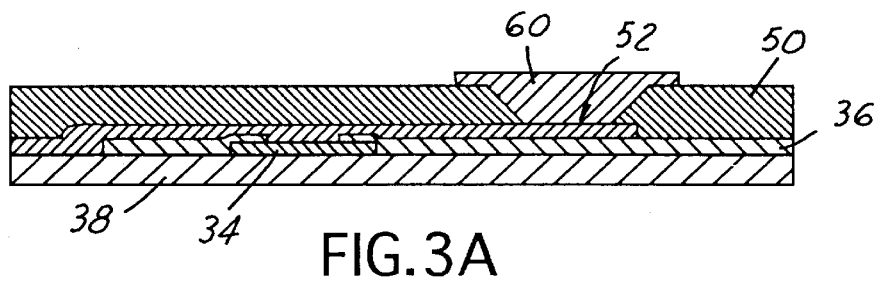
FIGS. 3A–3B are enlarged, cross-sectional views of a second embodiment of the present invention method for forming solder balls wherein a UBM layer is deposited before the deposition of the photoresist layer.
Figure 3B:
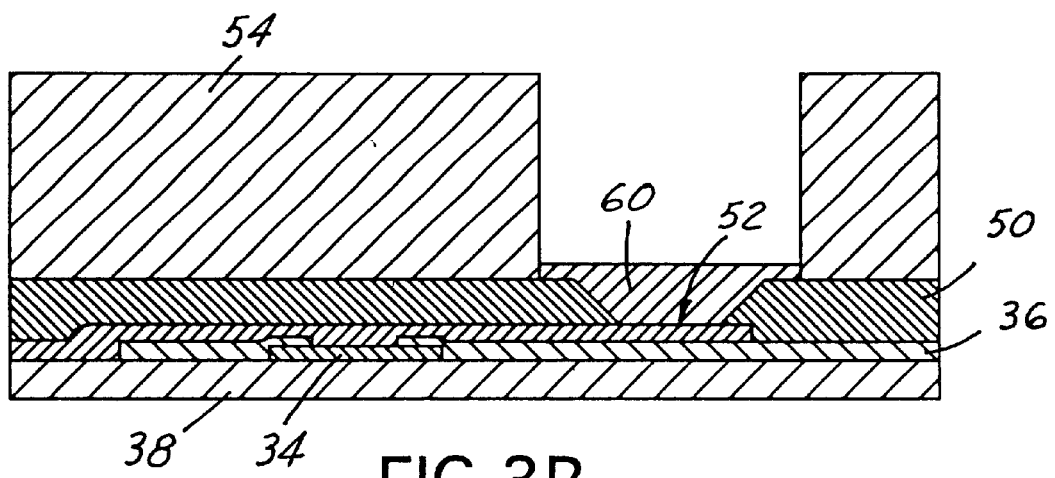

In an alternate embodiment, as shown in FIGS. 3A and 3B, wherein a UBM layer 60 is first formed on the I/O redistribution pad 52 prior to the deposition of the photoresist layer 54. The photoresist layer 54 is then deposited and the same processing steps can be followed as in the preferred embodiment.

Figure 2G:
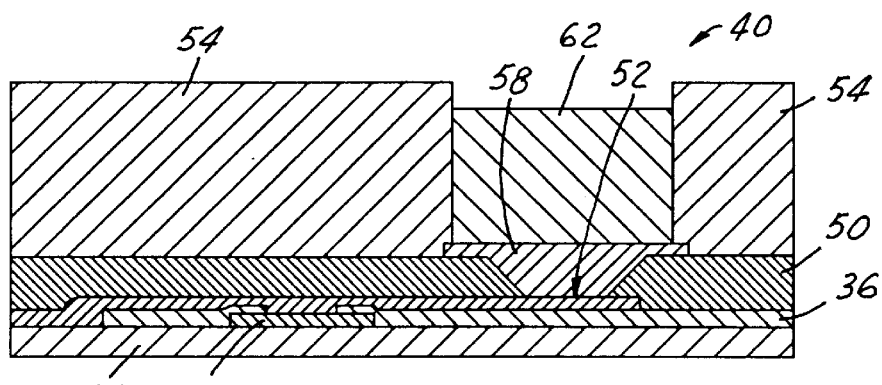

In the next step of the process, as shown in FIG. 2G, a solder paste material is deposited into the opening 56 forming a solder bump 62. The deposition process for the solder paste material may be electroplating or electroless plating. The solder paste material utilized may be a Pb/Sn alloy or a solder that does not contain Pb.

Figure 2H:
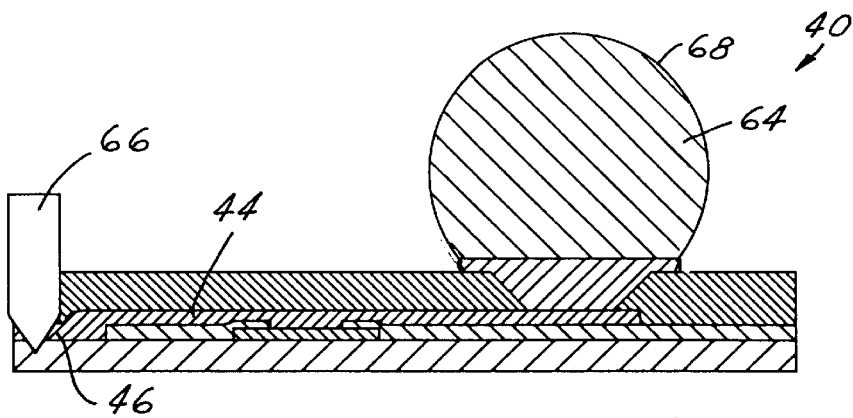

In the final step of the process, as shown in FIG. 2H, the photoresist layer 54 is first removed followed by a solder reflow process for reflowing the solder bump 62 into a solder ball 64. A diamond saw 66 is then used to cut through the first end 46 of the I/O redistribution line 44 and simultaneously severing inter-die and intra-die connections to the semiconductor structure 40. The present invention novel method further provides the additional benefit that, on top of the surface 68 of the solder ball 64, other metal may be electroplated to achieve better chemical affinity, as long as the die severing step has not been carried out.

Figure 4:
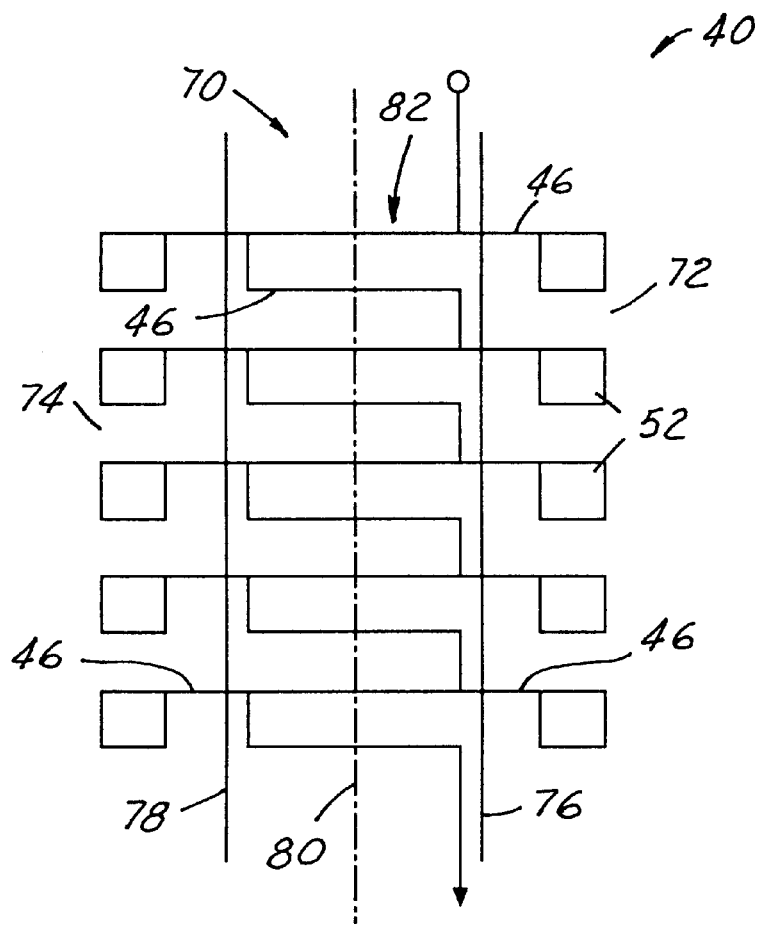
FIG. 4 is a plane view of the present invention serpentine-shaped electrode that connects two IC dies.

The diamond saw 66 severing the I/O redistribution line 44 is further shown in FIG. 4 in a plane view. As shown in FIG. 4, the first end 46 of the plurality of I/O redistribution lines 44 are connected together in a serpentine-shape in a border area 70 between two adjacent IC dies 72 and 74. The edge of the IC die 72 is 76, while the edge of the IC die 74 is 78. A diamond saw cut line 80 through the center of the serpentine-shaped electrode 82 severs all inter-die connections and intra-die connections preventing any shorts therein-between. Only a single cut by a cutting disk such as a diamond saw is necessary for performing the present invention operation in severing the multiplicity of IC dies. As shown in FIG. 4, every I/O redistribution line 46 crosses the border region 70 at least once in a horizontal direction and therefore, can be severed in a single cut operation.

The present invention method for forming wafer level package that has a serpentine-shaped electrode formed along a scribe line and the package formed have therefore been amply described in the above description and in the appended drawings of FIGS. 2A–4.

While the present invention has been described in an illustrative manner, it should be understood that the terminology used is intended to be in a nature of words of description rather than of limitation.

Furthermore, while the present invention has been described in terms of a preferred and an alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A method for forming wafer level package having serpentine-shaped electrode formed along a scribe line comprising the steps of:

providing a wafer that is preprocessed with a plurality of IC dies formed on a top surface, each of said plurality of IC dies having a plurality of input/output (I/O) pads formed on top, each of said plurality of IC dies being spaced-apart from its immediate adjacent IC dies by a border that has at least a width of a scribe line;

depositing a first metal layer on said top surface of the wafer and patterning into an I/O redistribution line with a first end in electrical communication with one of said plurality of I/O pads and a second end extending toward and intelecting said border between said immediate adjacent IC dies, said patterning step further forms a serpentine-shaped electrode for a subsequent plating step on said border in electrical communication with said second end of the I/O redistribution line;

depositing an insulating layer on said top surface of the wafer and forming an opening over an I/O redistribution pad exposing said first metal layer;

depositing a photoresist layer to a thickness sufficient for forming a solder bump and forming an opening to expose said I/O redistribution pad;

depositing a solder paste by a plating technique filling said opening to form a solder bump; and removing said photoresist layer and reflowing said solder bump into a solder ball.

2. A method for forming wafer level package having serpentine-shaped electrode formed along a scribe line according to claim 1 further comprising the step of depositing said first metal layer from a metal of Al, Cu, or alloys thereof.

3. A method for forming wafer level package having serpentine-shaped electrode formed along a scribe line according to claim 1 further comprising the step of forming said plurality of input/output pads on said plurality of IC dies from a metal of Al, Cu or alloys thereof.

4. A method for forming wafer level package having serpentine-shaped electrode formed along a scribe line according to claim 1 further comprising the step of forming said serpentine-shaped electrode from Al or Cu, or alloys thereof in a saw-tooth configuration.

5. A method for forming wafer level package having serpentine-shaped electrode formed along a scribe line according to claim 1 further comprising the step of depositing said solder paste of a lead-containing or a non-lead-containing solder.

6. A method for forming wafer level package having serpentine-shaped electrode formed along a scribe line according to claim 1 further comprising the step of depositing said solder paste by a technique of electroplating or electroless plating.

7. A method for forming wafer level package having serpentine-shaped electrode formed along a scribe line according to claim 1 further comprising the step of, prior to said solder paste deposition step, depositing an under-bump-metallurgy layer on said I/O redistribution pad.

8. A method for forming wafer level package having serpentine-shaped electrode formed along a scribe line according to claim 1 further comprising the step of dicing said plurality of IC dies from the wafer by cutting with a diamond saw through a center of said serpentine-shaped electrode.

9. A method for forming wafer level package having serpentine-shaped electrode formed along a scribe line according to claim 1 further comprising the step of cutting through said serpentine-shaped electrode with a diamond saw to sever the plurality of IC dies and to prevent any inter-die or intra-die shorts.

10. A method for forming wafer level package having serpentine-shaped electrode formed along a scribe line according to claim 1 further comprising the step of depositing said solder paste from a material containing Pb and Sn.

11. A method for forming wafer level package having serpentine-shaped electrode formed along a scribe line comprising the steps of:

providing a wafer that is preprocessed with a plurality of IC dies formed on a top surface, each of said plurality of IC dies having a plurality of input/output (I/O) pads formed on top, each of said plurality of IC dies being spaced-apart from its immediate adjacent IC dies by a border that has at least a width of a scribe line;

depositing a first metal layer on said top surface of the wafer and patterning into an I/O redistribution line with a first end in electrical communication with one of said plurality of I/O pads and a second end extending toward said border between said immediate adjacent IC dies, said patterning step further forms a serpentine-shaped electrode for a subsequent plating step on said border in electrical communication with said second end of the I/O redistribution line;

depositing an insulating layer on said top surface of the wafer and forming an opening over an I/O redistribution pad exposing said first metal layer;

depositing a photoresist layer to a thickness sufficient for forming a solder bump and forming an opening to expose said I/O redistribution pad;

depositing a solder paste by a plating technique filling said opening to form a solder bump;

removing said photoresist layer and reflowing said solder bump into a solder ball; and dicing said plurality of IC dies from the wafer by cutting with a diamond saw through a center of said serpentine-shaped electrode.

12. A method for forming water level package having serpentine-shaped electrode formed along a scribe line according to claim 11 further comprising the step of depositing said first metal layer from a metal of Al, Cu, or alloys thereof.

13. A method for forming wafer level package having serpentine-shaped electrode formed along a scribe line according to claim 11 further comprising the step of forming said plurality of input/output pads on said plurality of IC dies from a metal of Al, Cu or alloys thereof.

14. A method for forming wafer level package having serpentine-shaped electrode formed along a scribe line according to claim 11 further comprising the step of forming said serpentine-shaped electrode from Al or Cu, or alloys thereof in a saw-tooth configuration.

15. A method for forming wafer level package having serpentine-shaped electrode formed along a scribe line according to claim 11 further comprising the step of depositing said solder paste of a lead-containing or a non-lead-containing solder.

16. A method for forming wafer level package having serpentine-shaped electrode formed along a scribe line according to claim 11 further comprising the step of depositing said solder paste by a technique of electroplating or electroless plating.

17. A method for forming wafer level package having serpentine-shaped electrode formed along a scribe line according to claim 11 further comprising the step of, prior to said solder paste deposition step, depositing an under-bump-metallurgy layer on said I/O redistribution pad.

18. A method for forming wafer level package having serpentine-shaped electrode formed along a scribe line according to claim 11 further comprising the step of cutting through said serpentine-shaped electrode with a diamond saw to sever the plurality of IC dies and to prevent any inter-die or intra-die shorts.

19. A method for forming wafer level package having serpentine- aped electrode formed along a scribe line according to claim 11 further comprising the step of depositing said solder paste from a material containing Pb and Sn.

* * * * *